United States Patent [19]

Suzuki et al.

[11] 4,440,618
[45] Apr. 3, 1984

[54] GAS DISCHARGE DEVICE COMPRISING A PRESSURE CONTROLLER FOR CONTROLLING A PRESSURE OVER A WIDE RANGE

[75] Inventors: Toshiyuki Suzuki; Kazuo Nakamura, both of Tokyo, Japan

[73] Assignee: Anelva Corporation, Tokyo, Japan

[21] Appl. No.: 475,862

[22] Filed: Mar. 16, 1983

[30] Foreign Application Priority Data

Mar. 19, 1982 [JP] Japan ................................ 57-42818

[51] Int. Cl.³ ............................................ C23C 15/00
[52] U.S. Cl. ................................... 204/298; 118/715
[58] Field of Search .......................... 204/298; 118/715

[56] References Cited

U.S. PATENT DOCUMENTS

| | | | |
|---|---|---|---|
| 4,138,306 | 2/1979 | Niwa | 118/715 |
| 4,270,999 | 6/1981 | Hassan et al. | 204/298 |
| 4,283,260 | 8/1981 | Thomas et al. | 204/298 |
| 4,345,968 | 8/1982 | Coe | 204/298 |
| 4,369,031 | 1/1983 | Goldman | 118/715 |

*Primary Examiner*—Arthur P. Demers
*Attorney, Agent, or Firm*—Laff, Whitesel, Conte & Saret

[57] ABSTRACT

In a gas discharge device for causing a gas discharge to start at a first pressure in a hollow space between a pair of electrodes and to continue at a second pressure lower than the first pressure therein, a gas pressure adjusting part is coupled to the hollow space to adjust a pressure between the first and the second pressures. The adjusting part comprises a needle valve which is controllable between the first and the second pressures and which has a double tapered orifice portion. Alternatively, the adjusting part comprises first and second sections for allowing a gas to flow at higher and lower flow rates so as to provide the first and the second pressures, respectively. The first section may comprise an additional hollow space controlled by a pair of solenoid controlled valves. The adjusting part cooperates with at least one of a gas introducing system and a gas exhausting system.

7 Claims, 8 Drawing Figures

GAS DISCHARGE DEVICE COMPRISING A PRESSURE CONTROLLER FOR CONTROLLING A PRESSURE OVER A WIDE RANGE

BACKGROUND OF THE INVENTION

This invention relates to a gas discharge device for causing a gas discharge to occur in a hollow space filled with a gas. It should be noted here that the concept of the term "gas discharge device" covers a sputtering device, a plasma chemical vapor deposition device, a dry etching device, or the like, although the sputtering device will be exemplified throughout the instant specification.

A conventional sputtering device of the type described is for use in depositing a layer on a substrate by sputtering a material of a target onto the substrate. For this purpose, the sputtering device comprises a chamber defining a hollow space, an anode electrode in the hollow space, and a cathode electrode opposite to the anode electrode in the hollow space, and is accompanied by a main power source for providing a voltage between the anode and the cathode electrodes. The substrate is placed on the anode electrode while the cathode electrode is operable as the target.

In order to carry out sputtering operation, a gas discharge should be caused to occur in the hollow space between the anode and the cathode electrodes. In order to deposit an excellent layer on the substrate, the gas discharge must be stable during the sputtering operation. However, the gas discharge is subjected to influence of various factors, such as a geometrical configuration of the anode and the cathode electrodes, a pressure in the hollow space, a voltage applied between the anode and the cathode electrodes, a distance therebetween, and the like. Moreover, an initial voltage for causing the gas discharge to start is different from a voltage for causing it to continue. It is therefore difficult to keep the gas discharge stable.

It is mentioned here that the Paschen's law is well known in the art to define a relationship among the initial voltage, the distance, and the pressure. According to the Paschen's law, the initial voltage for the gas discharge becomes low with a rise in the pressure and with an increase in the distance.

In accordance with the teaching of Paschen's law, the distance between the anode and the cathode electrodes may be widened once from a predetermined distance at a start of the gas discharge and be returned to the predetermined distance after the start of the gas discharge. Provision should, however, be made of a mechanism for moving one of the electrodes nearer to the other and further therefrom on controlling the distance. The mechanism is intricate in structure. The control of the distance is difficult and time consuming.

Alternatively, an auxiliary electrode is placed to cause the gas discharge to start. An extra power source should be prepared in addition to the main power source because a high voltage is impressed on the auxiliary electrode. A restriction is inevitably imposed on design of the target because the auxiliary electrode must be adjacent to the target or the cathode electrode.

As will later be described with reference to one of nearly ten figures of the accompanying drawing, it is possible to change the gas pressure in the hollow space at the start of the gas discharge. More specifically, the pressure is increased to a high pressure or an initial pressure higher than a normal pressure and is returned to the normal pressure after the start of the gas discharge. It is, however, difficult to automatically increase the pressure to the initial pressure at the start of the gas discharge because the initial pressure is fairly higher than the normal pressure.

SUMMARY OF THE INVENTION

It is an object of this invention to provide a gas discharge device wherein a pressure is controllable over a wide range to cause a gas discharge to start and to continue.

It is another object of this invention to provide a gas discharge device of the type described, which is automatically operable.

A gas discharge device to which this invention is applicable includes a chamber defining a hollow space, a first electrode in the hollow space, a second electrode opposite to the first electrode in the hollow space, voltage supplying means for supplying a voltage between the first and the second electrodes, exhausting means for exhausting said hollow space, and gas introducing means for introducing a gas into the hollow space. According to this invention, the gas discharge device comprises pressure adjusting means coupled to at least one of the exhausting means and the gas introducing means for adjusting the pressure between a first and a second pressure at which the voltage causes a gas discharge to start and to continue between the first and the second electrodes, respectively.

DESCRIPTION OF THE PREFERRED EMBODIMENTS

Figure 1:
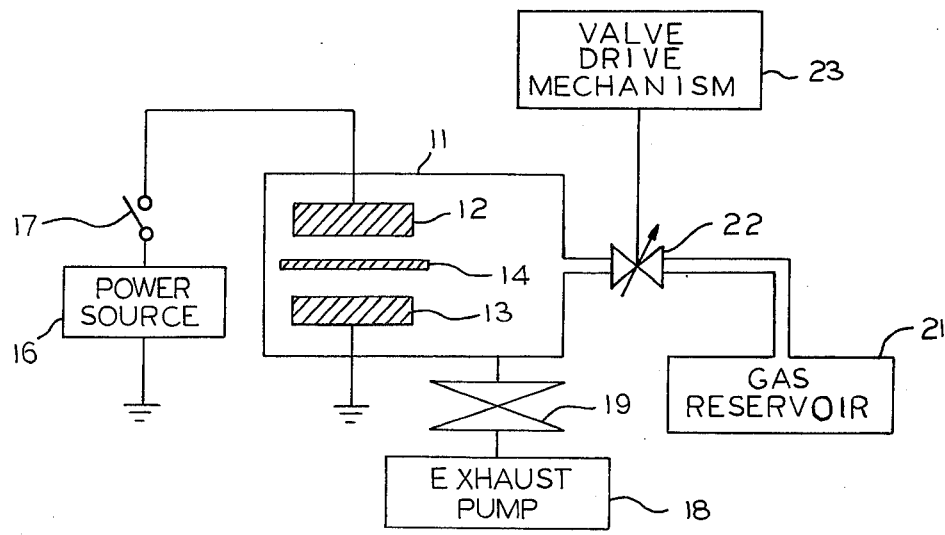
FIG. 1 shows a block diagram of a conventional gas discharge device.

Referring to FIG. 1, a conventional gas discharge device is operable as a sputtering device and comprises a gas pressure adjusting part for use in controlling a gas pressure in a hollow space of the sputtering device. The hollow space has a predetermined volume between 5 liters and 5000 liters. Let the predetermined volume be equal to 200 liters. The device comprises a chamber 11 defining the hollow space, a first electrode 12 in the hollow space, and a second electrode 13 opposite to the first electrode 12 in the hollow space. The first electrode 12 serves as a cathode operable as a target electrode. The second electrode 13 is used as an anode. At least one substrate (not shown) is located on the second electrode 13 to be subjected to sputtering as will presently be described. A shutter 14 is placed intermediate between the first and the second electrodes 12 and 13. The shutter 14 is for sheltering the first or the target electrode 12 while sputtering operation is not carried out in the device.

A voltage source 16 is electrically connected between the first and the second electrodes 12 and 13 through a switch 17 to provide a voltage therebetween and, thereby, to cause a gas discharge to occur in the hollow space between the first and the second electrodes 12 and 13. Let the voltage be a predetermined voltage selected between 500 and 600 volts.

The device further comprises a gas exhausting system for exhausting the hollow space at a constant exhaust rate which is specified by an effective exhaust rate. The exhausting system comprises a vacuum pump 18 and a main valve 19 between the chamber 11 and the vacuum pump 18. The main valve 19 has a main valve conductance and cooperates with the vacuum pump 18 to achieve the exhaust rate. In the following description, it will be assumed that the gas exhausting system is always put into operation at the exhaust rate.

A gas reservoir 21 is attached to the device. A gas is introduced from the reservoir 21 into the hollow space. A flow control valve 22 is placed between the chamber 11 and the gas reservoir 21. The flow control valve 22 has a control valve conductance variable within a prescribed range and is controlled by a valve drive mechanism 23. A combination of the flow control valve 22 and the valve drive mechanism 23 serves as a gas introducing system.

The gas has a pressure in the hollow space. The pressure is dependent on the effective exhaust rate and an amount of the gas which is introduced through the flow control valve 22. In other words, the pressure in the hollow space is determined by the main valve conductance and the control valve conductance. Accordingly, it is possible to control the pressure by regulating the main and the control valve conductances. Herein, the gas discharge is assumed to start in the hollow space when the pressure in the hollow space reaches a first pressure of, for example, $5 \times 10^{-2}$ Torr and that the sputter operation is carried out at a second pressure of, for example, $5 \times 10^{-3}$ Torr. The gas discharge continues at the second pressure when the pressure is reduced from the first pressure. In these senses, the first and the second pressures may be called an initial and a sputtering pressure, respectively.

Let the pressure be kept at the first pressure by regulating the main valve 19 and the flow control valve 22. In the meanwhile, the first electrode 12 is sheltered from the second electrode 13 by the shutter 14 and the first and the second electrodes 12 and 13 are supplied with the voltage as described before. In the example being illustrated, the flow control valve 22 alone is regulated by the valve drive mechanism 23 after the hollow space is exhausted at the exhaust rate. Under the circumstances, the gas discharge starts in the hollow space between the first and the second electrodes 12 and 13 when the shutter 14 is put aside. After the start of the gas discharge, the flow control valve 22 must be controlled to reduce a flow rate of the gas so as to reduce the pressure down to the second pressure. When the shutter 14 is put aside after reduction of the pressure, the sputter operation is carried out in a well-known manner to deposit a layer on the substrate.

Thus, the flow control valve 22 should be controlled so as to regulate the flow rate and thereby to change the pressure between the first and the second pressures. Such control of the flow rate must be carried out over a wide range, as will presently become clear. It may be possible to manually control the flow rate over the wide range with a great care. However, it is difficult to automatically cover the whole wide range by the use of a conventional flow control valve. More particularly, the flow rate must be determined with an accuracy of ±1 SCCM during the sputtering operation if the flow rate is between 0 and 100 SCCM, where SCCM is an abbreviation for Standard Cubic Centimeter per Minute and is representative of a flow rate which is converted to that at 1 atmospheric pressure. Under the circumstances, a minimum controllable value of the flow rate is as coarse as 2 SCCM.

On the other hand, the maximum flow rate is 10,000 SCCM. At any rate, the flow rate should be measured at an accuracy of ±100 SCCM at the start of the gas discharge. At this time, the minimum controllable value is degraded to 200 SCCM.

It is to be noted here that the conventional flow control valve can automatically control a flow rate with an accuracy of about 1 percent at most. From this fact, it is understood that the conventional flow control valve can not be used to control the flow rate over the wide range between 0 and 10,000 SCCM.

Although the above-mentioned description is directed to the introducing system, this applies to the exhausting system in which the exhaust rate is controlled to adjust the pressure between the first and the second pressures.

Figure 2:
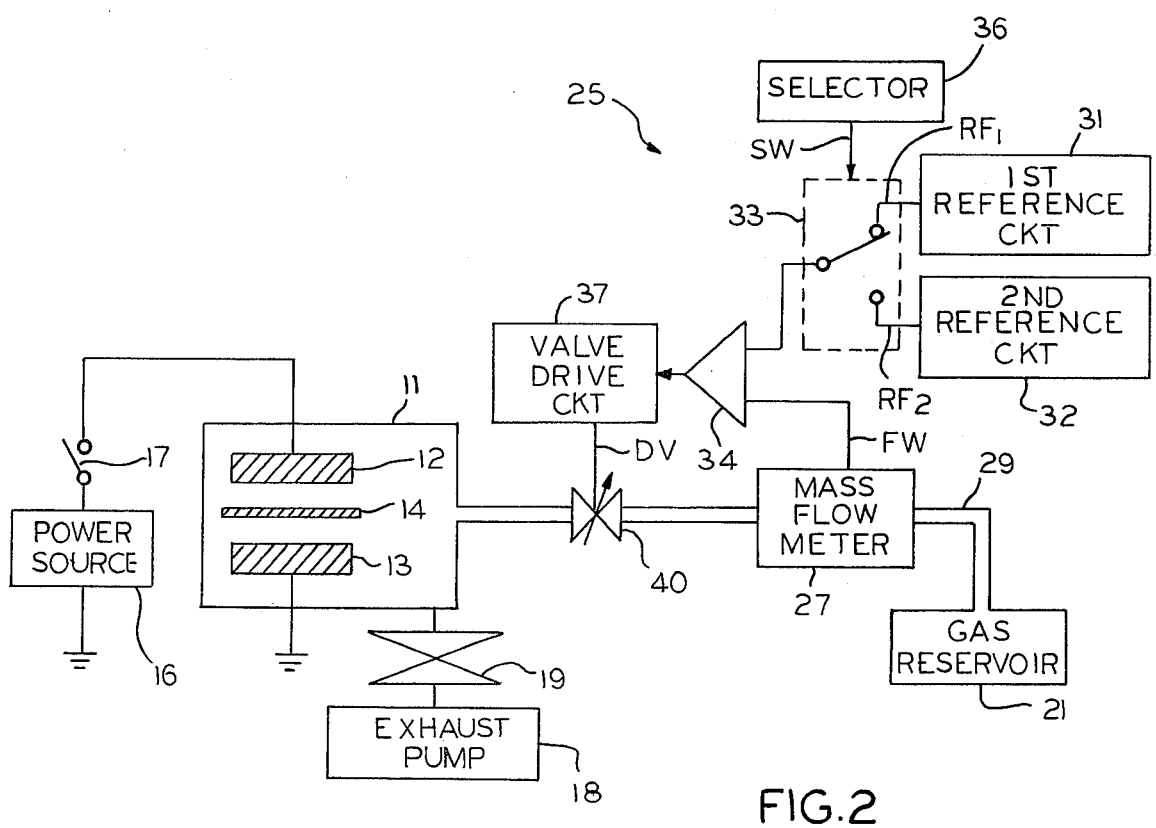
FIG. 2 shows a block diagram of a gas discharge device according to a first embodiment of this invention.

Referring to FIG. 2, a gas discharge device according to a first embodiment of this invention is also used as a sputtering device and comprises similar parts designated by like reference numerals. In the illustrated gas discharge device, the hollow space enclosed with the chamber 11 has a volume of, for example, 200 liters. A pressure controller 25 is for controlling the flow rate throughout a wide range between 0 and 10,000 SCCM on condition that the exhaust rate is, for example, 100 liters per second when converted to 1 atmospheric pressure. The pressure controller 25 comprises a mass flow meter 27 for measuring the flow rate to produce a flow rate signal FW representative of the flow rate. The mass flow meter 27 is coupled to a hollow pipe or a conduit 29 which allows the gas to flow into the hollow space. The mass flow meter 29 may be of a type comprising a thermocouple and a heater for the thermocouple.

The pressure controller 25 comprises a first reference circuit 31 for producing a first reference signal $RF_1$ representative of a first reference flow rate and a second reference circuit 32 for producing a second reference signal $RF_2$ representing a second reference flow rate. The first and the second reference flow rates are for establishing the first and the second pressures in the hollow space, respectively. The gas discharge starts and continues at the first and the second pressures, respectively, as described in conjunction with FIG. 1. The first and the second reference signals $RF_1$ and $RF_2$ are selectively supplied through a changeover switch 33 to a comparator 34. A selector 36 produces a switching signal SW for the switch 33 to switch the first and the second reference signals $RF_1$ and $RF_2$ from one to the other. The selector 36 may be manually or automatically put into operation to produce the switching signal SW.

At the start of the gas discharge, the first reference signal $RF_1$ is selected in response to the switching signal SW to be sent to the comparator 34. Responsive to the first reference signal $RF_1$ and the flow rate signal FW, the comparator 34 compares the flow rate with the first reference flow rate to calculate a first difference between the flow rate and the first reference flow rate and to produce a first difference signal representative of the first difference.

Likewise, the comparator 34 compares the flow rate with the second reference flow rate to produce a second difference signal representative of a second difference between the flow rate and the second reference flow rate during the sputtering operation.

Responsive to each of the first and the second difference signals, a valve drive circuit 37 produces a valve drive signal DV by amplifying each of the first and the second difference signals.

Figure 3:
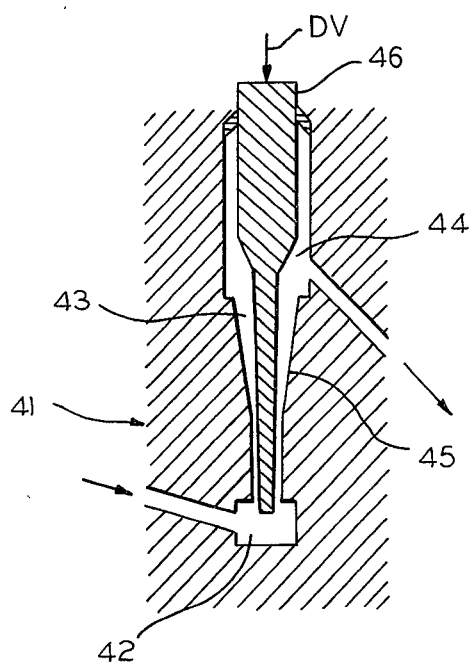
FIG. 3 shows a partial sectional view of a needle valve for use in the gas discharge device illustrated in FIG. 2.
Figure 4:
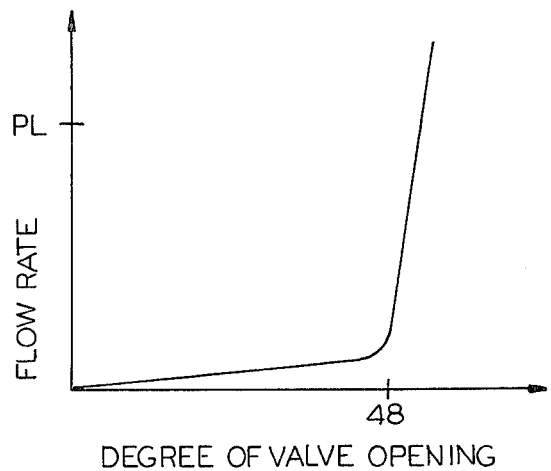
FIG. 4 shows a view for describing a characteristic of the needle valve illustrated in FIG. 3.

Referring to FIGS. 3 and 4 together with FIG. 2, the valve drive signal DV is supplied from the valve drive circuit 37 to a needle valve 40 which is illustrated in FIG. 3 and which is capable of controlling the flow rate over the above-mentioned wide range in accordance with a degree of valve opening versus flow rate characteristic exemplified in FIG. 4. The needle valve 40 has a body 41 defining an internal space. The internal space is divided into an inlet portion 42, an orifice portion 43, and an outlet portion 44. The orifice portion 43 is defined by an internal wall surface 45. The needle valve 40 is interposed in the conduit 29 as illustrated in FIG. 2 with the inlet and the outlet portions 42 and 44 connected thereto. It should be noted here that the orifice portion 43 has a first tapered portion contiguous to the outlet portion 44 and a second tapered portion between the first tapered portion and the inlet portion 42 and that the first tapered portion has a sharply tapered or varied circumferential wall in comparison with the second tapered portion.

The needle valve 40 comprises a stem 46 movable upwardly or downwardly of FIG. 3 in response to the valve drive signal DV supplied from the valve drive circuit 37 (FIG. 2). With this needle valve 40, it is possible to accomplish the characteristic exemplified in FIG. 4. More particularly, the stem 46 is moved to the first tapered portion upwardly of FIG. 3 when the valve drive circuit 31 produces the valve drive signal DV in response to the first difference signal at the start of the gas discharge. At this time, the degree of valve opening reaches a transition point 48 (FIG. 4). When the stem 46 is moved farther upwardly, the flow rate is rapidly and widely varied with an increase of the degree of valve opening. This is because the first tapered portion is sharper in inclination than the second tapered portion. Accordingly, it is possible to put the flow rate into the first reference flow rate depicted at PL (FIG. 4) of, for example, 10,000 SCCM, which is necessary for providing the first pressure. Thus, the needle valve 40 enables the pressure in the hollow space to reach the first pressure in relation to the exhaust rate. The flow rate may have a tolerance of ±10 percents relative to the first reference flow rate.

After the gas discharge starts in the hollow space in the above-mentioned manner, the stem 46 is moved to the second taper portion downwardly of FIG. 3 in response to the valve control signal DV resulting from the second difference signal $RF_2$. Thus, the degree of valve opening becomes less than the transition point 48. Accordingly, the flow rate is reduced to the second reference flow rate between 0 and 100 SCCM. In this event, the flow rate can precisely be controlled at an accuracy of ±2 SCCM.

Anyway, the needle valve 40 can adjustably vary the flow rate over the wide range in relation to the exhaust rate.

With the illustrated gas discharge device, it is possible to easily and automatically cause the gas discharge to start by the use of the pressure controller 25 comprising the needle valve 40. In addition, no extra power source is necessary except the power source 16 in order to cause the gas discharge to start in the hollow space. The needle valve 40 may be substituted for the main valve 19. The gas discharge device makes it necessary to prepare an impedance matching circuit usually used in a conventional high frequency sputtering device.

Figure 5:
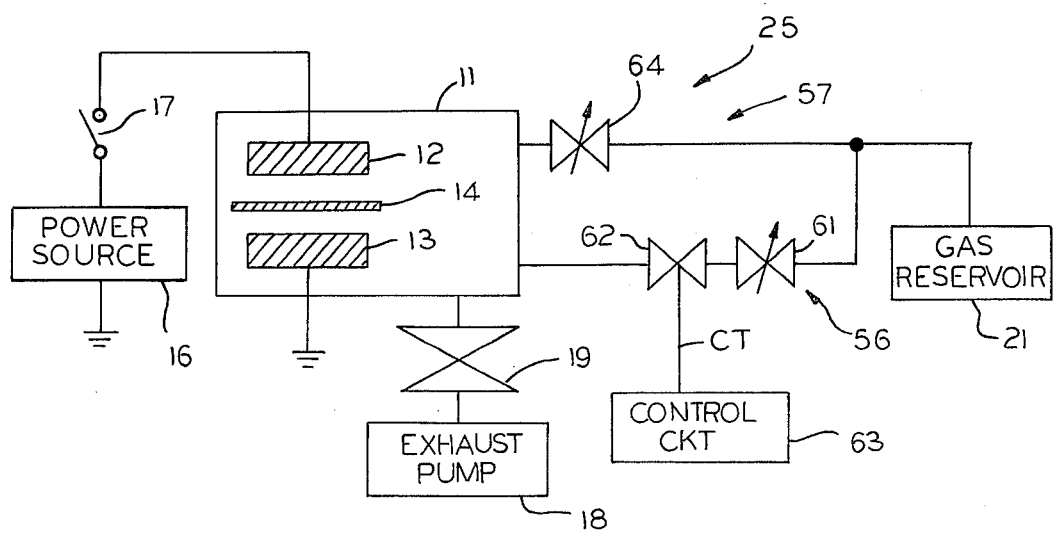
FIG. 5 shows a block diagram of a gas discharge device according to a second embodiment of this invention.

Referring to FIG. 5, a gas discharge device according to a second embodiment of this invention comprises similar parts designated by like reference numerals. Let the chamber 11 and the exhausting system be identical with those illustrated with reference to FIG. 2. The illustrated pressure controller 25 is coupled to the chamber 11 and the introducing part to which the gas reservoir 21 is attached. The controller 25 comprises a first section 56 and a second section 57. The first section 56 is for use in causing the gas discharge to start in cooperation with the second section 57. For this purpose, the first section 56 comprises a first flow control valve 61 having a first conductance and a solenoid controlled valve 62 controlled by a control circuit 63. The control circuit 63 produces a control signal CT to selectively close and open the solenoid controlled valve 62 by energizing the same. The first section 56 serves to introduce the gas into the hollow space at a first preselected flow rate determined by the first conductance. The first preselected flow rate is for adjusting the pressure to the first pressure of, for example, $5 \times 10^{-2}$ Torr and may be more than 1,000 SCCM. Typically, the first preselected flow rate is 10,000 SCCM.

The second section 57 comprises a second flow control valve 64 having a second conductance considerably lower than the first conductance. The second flow control valve 64 is operable to introduce the gas into the hollow space at a second preselected flow rate determined by the second conductance. The flow rate may be less than 100 SCCM and is, for example, 50 SCCM.

At any rate, the second section 57 serves to cause the gas discharge to continue after the start of the gas discharge by adjusting the pressure to the second pressure of, for example, $5 \times 10^{-3}$ Torr in relation to the exhaust rate of, for example, 100 liters per second.

Figure 6:
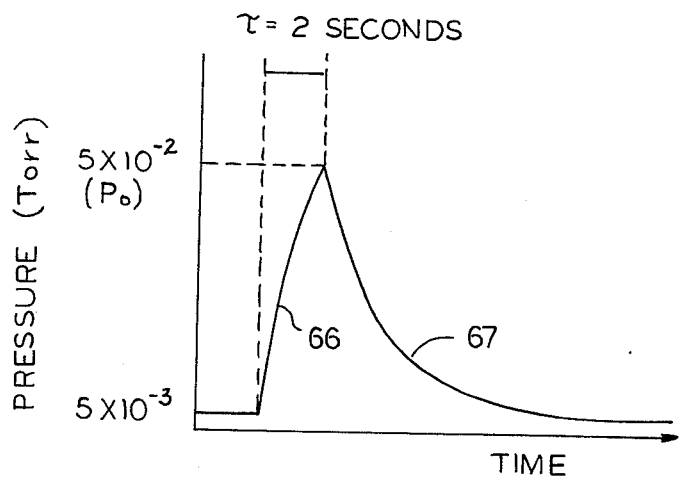
FIG. 6 shows a view for describing operation of the gas discharge device illustrated in FIG. 5.

Referring to FIG. 6 afresh and FIG. 5 again, the solenoid controlled valve 62 is opened in response to the control signal CT to cause the gas discharge to start in the hollow space. In this event, the first and the second flow control valves 61 and 64 are opened also. Inasmuch as the first conductance is considerably higher than the second one, a great deal of the gas is rapidly introduced into the hollow space with the exhausting system kept exhausting the hollow space at the exhaust rate. Consequently, the pressure is quickly raised up to the first pressure, as shown at 66 in FIG. 6. When the pressure reaches the first pressure, the solenoid controlled valve 62 is closed by extinction of the control signal CT with the first and the second flow control valves 61 and 64 kept opened. Thus, the solenoid controlled valve 62 is momentarily opened a predetermined duration. The predetermined duration is determined by a time constant $\tau$ given by:

$$\tau = V/S, \qquad (1)$$

where V is representative of a volume of the hollow space and S, the exhaust rate.

Let the volume V and the exhaust rate be 200 liters and 100 liters per second, respectively. At this time, the time constant $\tau$ becomes equal to 2 seconds. In order to raise the pressure from $5 \times 10^{-3}$ Torr to $5 \times 10^{-2}$ Torr during the predetermined duration of 2 seconds, consideration should be paid to the first conductance and to a supplying pressure of the gas fed from the gas reservoir 21 to hollow space through the first control valve 61. According to inventors' experimental studies, the first conductance and the supplying pressure were $4.9 \times 10^{-3}$ liters per second and 1 kgf per centimeter square, respectively.

After elapse of the predetermined duration, the solenoid controlled valve 62 is closed in response to the control signal CT. Inasmuch as the exhausting system continuously exhausts the hollow space at the exhaust rate, the pressure in the hollow space is gradually reduced at the time constant to the second pressure of $5 \times 10^{-3}$ Torr, as shown at 67 in FIG. 6.

Figure 7:
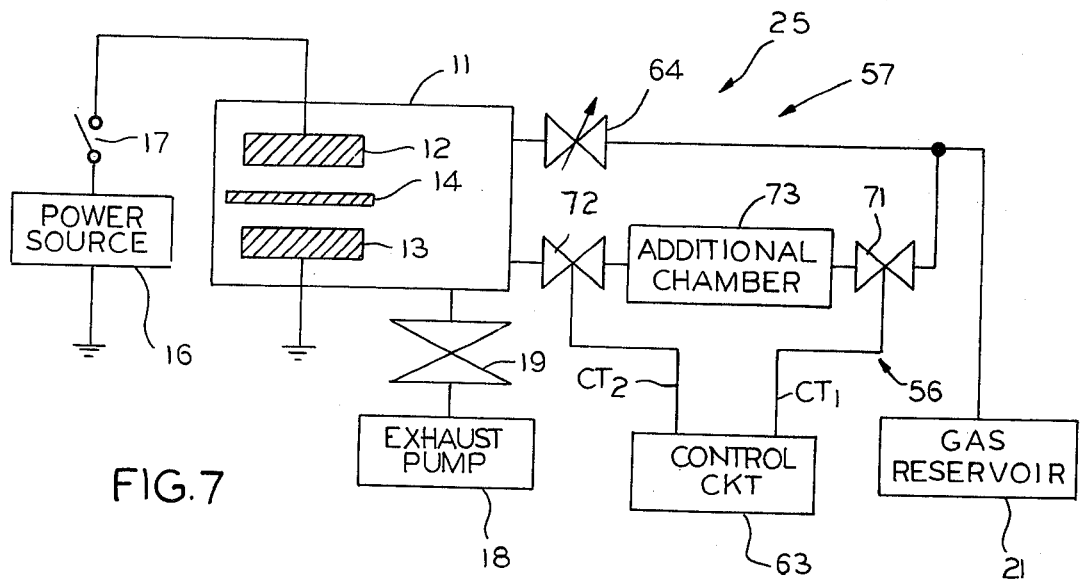
FIG. 7 shows a block diagram of a gas discharge device according to a third embodiment of this invention.

Referring to FIG. 7, a gas discharge device according to a third embodiment of this invention is similar to that illustrated with reference to FIG. 5 except that the first section 56 comprises first and second solenoid controlled valves 71 and 72 and an additional chamber 73 intermediate between the first and the second solenoid controlled valves 71 and 72. In the example being illustrated, the chamber 11 and the exhaust system be identical with those illustrated in FIG. 5. Let the volume of the chamber 11 be represented by V. The additional chamber 73 defines an additional hollow space having a volume represented by $V_1$. The first and the second solenoid controlled valves 71 and 72 are interposed between the gas reservoir 21 and the additional chamber 73 and between the chamber 11 and the additional chamber 73, respectively, and are selectively operated in response to first and second control signals $CT_1$ and $CT_2$ supplied from a control circuit depicted at 63. Thus, the second section 57 does not comprise a flow control valve in FIG. 7. In this connection, the second flow control valve 64 in the first section 56 may be solely called a flow control valve hereinafter.

As is the case with the gas discharge device illustrated with reference to FIG. 4, let the volume of the chamber 11, the exhaust rate, the first pressure, and the second pressure be equal to 200 liters, 100 liters per second, $5 \times 10^{-2}$ Torr, and $5 \times 10^{-3}$ Torr, respectively. The time constant $\tau$ is therefore equal to 2 seconds as discussed heretobefore in conjunction with FIG. 4.

The first solenoid controlled valve 71 is opened in response to the first control signal $CT_1$, with the second solenoid controlled valve 72 left closed, to cause the gas discharge to start in the hollow space between the first and the second electrodes 12 and 13. As a result, the additional chamber 73 is filled with the gas to a high pressure which is higher than the first pressure and which will be represented by $P_1$. Let the high pressure $P_1$ be equal to 1 kgf per centimeter square. In this event, the flow control valve 64 is continuously opened to keep the pressure in the chamber 11 at the second pressure of $5 \times 10^{-3}$ Torr in cooperation with the exhausting system.

Subsequently, the second solenoid controlled valve 72 is opened in response to the second control signal $CT_2$ while the first solenoid controlled valve 71 is closed by extinction of the first control signal $CT_1$.

Figure 8:
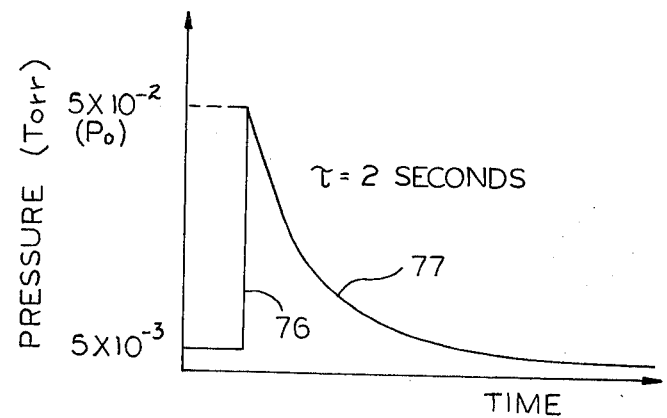
FIG. 8 shows a view for describing operation of the gas discharge device illustrated in FIG. 7.

Referring to FIG. 8 afresh and FIG. 7 again, the pressure in the hollow space should momentarily be raised up to the first pressure of $5 \times 10^{-2}$ Torr, as shown at 76 in FIG. 8. In order to carry out such operation, the volume $V_1$ of the additional chamber 73 and the high pressure $P_1$ therein must be selected in relation to the volume V of the chamber 11 and the pressure therein. As is well known in the art, the volume $V_1$ of the additional chamber 73 is given by:

$$V_1 = V \cdot P_0/P_1, \qquad (2)$$

where $P_0$ represents the first pressure.

When the volume V of the chamber 11, the first pressure $P_0$, and the pressure $P_1$ are 200 liters, $5 \times 10^{-2}$ Torr, and 1 kgf per centimeter square, respectively, the volume $V_1$ of the additional chamber 73 may be equal to 6.6 cm$^3$. If the volume V of the chamber 11 is between 5 and 5,000 liters, the volume $V_1$ of the additional chamber 73 may be between 0.1 and 100 cm$^3$.

Thus, the first section 56 serves to cause the gas discharge to start in the hollow space when the pressure in the chamber 11 reaches the first pressure of $5 \times 10^{-2}$ Torr.

After the pressure is raised up to the first pressure, the second solenoid controlled valve 72 is closed by extinction of the second control signal $CT_2$ while the first solenoid controlled valve 71 is opened in response to the first control signal $CT_1$. Inasmuch as the exhausting system continuously exhausts the hollow space, the pressure is gradually reduced to the second pressure of $5 \times 10^{-3}$ Torr, as shown at 77 in FIG. 8. At this time, the gas discharge continues in the hollow space.

While this invention has thus far been described in conjunction with a few embodiments thereof, it will now be possible for those skilled in the art to put this invention into practice in various other manners. For example, each of the flow control valves 64 illustrated in FIGS. 5 and 7 may be closed while the first section 56 introduces the gas into the hollow space. In this event, the first preselected flow rate is determined in relation to the exhaust rate alone. The pressure controller 25 may be attached to the exhausting system. This invention is applicable to a chemical vapor deposition device, a plasma etching device, or the like, as well as to the sputtering device.

What is claimed is:

1. A gas discharge device including a chamber defining a hollow space, a first electrode in said hollow space, a second electrode opposite to said first electrode in said hollow space, voltage supplying means for supplying a voltage between said first and said second electrodes, exhausting means for exhausting said hollow space, and gas introducing means for introducing a gas into said hollow space, said voltage causing a gas discharge to start at a first pressure and to continue at a second pressure which is lower than said first pressure, in said hollow space between said first and said second electrodes, said gas discharge comprising pressure adjusting means coupled to at least one of said exhausting means and said gas introducing means for adjusting said pressure between said first and said second pressures at a first and a second flow rate which are variable within a first and a second predetermined range, respectively, said first predetermined range being higher than said second predetermined range by a preselected order.

2. A gas discharge device as claimed in claim 1, wherein said pressure adjusting means comprises:
   a hollow pipe connected to said gas introducing means for allowing said gas to flow into said hollow space at a flow rate; and
   valve means coupled to said hollow pipe for adjustably varying said flow rate between said first and said second flow rates in relation to an exhaust rate at which said exhausting means exhausts said hollow space.

3. A gas discharge device as claimed in claim 1, wherein said pressure adjusting means comprises:
   first means coupled to said gas introducing means and said chamber for introducing said gas into said hollow space at said first flow rate; and
   second means coupled to said gas introducing means and said chamber for introducing said gas into said hollow space at said second flow rate which is lower than said first preselected flow rate to adjust said pressure to said second pressure in relation to an exhaust rate at which said exhausting means exhausts said hollow space;
   said first flow rate adjusting said pressure to be said first pressure at least in relation to said exhaust rate.

4. A gas discharge device as claimed in claim 3, wherein said first means comprises:
   an additional chamber defining an additional hollow space;
   first valve means coupled between said additional chamber and said gas introducing means for adjustably introducing said gas from said gas introducing means into said additional hollow space to a high pressure which is higher than said first pressure; and
   second valve means coupled between said additional chamber and said chamber for adjustably transferring the gas of said high pressure from said additional hollow space at said first flow rate to the hollow space in which said first and said second electrodes are disposed.

5. A gas discharge device as claimed in claim 1, wherein said preselected order is more than ten.

6. A gas discharge device as claimed in claim 5, wherein said first predetermined range is between 0 and 100 SCCM, while said second predetermined range is between 1,000 and 10,000 SCCM.

7. A gas discharge device as claimed in claim 1, wherein said pressure increases from said second pressure to said first pressure during a predetermined period which is no longer than two seconds.

* * * * *